United States Patent
Li et al.

(10) Patent No.: US 9,685,538 B2
(45) Date of Patent: Jun. 20, 2017

(54) LOW TEMPERATURE POLYSILICON THIN FILM TRANSISTOR AND METHOD FOR FABRICATING SAME

(71) Applicant: Shenzhen China Star Optoelectronics Technology Co., Ltd., Shenzhen, Guangdong (CN)

(72) Inventors: Songshan Li, Guangdong (CN); Xiaoxing Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 144 days.

(21) Appl. No.: 14/426,247

(22) PCT Filed: Dec. 30, 2014

(86) PCT No.: PCT/CN2014/095567
§ 371 (c)(1),
(2) Date: Mar. 5, 2015

(87) PCT Pub. No.: WO2016/086484
PCT Pub. Date: Jun. 9, 2016

(65) Prior Publication Data
US 2016/0343830 A1   Nov. 24, 2016

(30) Foreign Application Priority Data

Dec. 5, 2014  (CN) .......................... 2014 1 0737078

(51) Int. Cl.
*H01L 29/66* (2006.01)
*H01L 21/268* (2006.01)
(Continued)

(52) U.S. Cl.
CPC .. *H01L 29/66757* (2013.01); *H01L 21/02592* (2013.01); *H01L 21/02675* (2013.01);
(Continued)

(58) Field of Classification Search
CPC ......... H01L 29/66757; H01L 21/02675; H01L 21/02667; H01L 21/02669; H01L 27/01;
(Continued)

(56) References Cited

U.S. PATENT DOCUMENTS

| | | | |
|---|---|---|---|
| 2005/0191812 A1* | 9/2005 | Pritchard | H01L 21/823807 438/299 |
| 2008/0145981 A1* | 6/2008 | Kim | H01L 29/78621 438/163 |
| 2011/0198592 A1* | 8/2011 | Kim | H01L 29/42384 257/57 |

* cited by examiner

*Primary Examiner* — Charles Garber
*Assistant Examiner* — Abdulfattah Mustapha
(74) *Attorney, Agent, or Firm* — Andrew C. Cheng

(57) ABSTRACT

The present invention provides a low temperature polysilicon thin film transistor and a fabricating method thereof. According to the method, a laser annealing process is performed to a remained portion of a a-Si layer on a substrate to form a first lightly doped drain (LDD) terminal, a second LDD terminal, a first phosphor material structure and a second phosphor material structure. A gate metal layer is then formed on the remained portion of the a-Si layer. A source metal layer and a drain metal layer are formed on the first doped layer and the second doped layer located at opposite sides of the gate metal layer, respectively. The present invention use the high temperature of the laser annealing process to perform a heat diffusion of phosphor material to form the LDD terminal and the phosphor material structure, the times of photomasks are used is reduced, and the process is simplified.

15 Claims, 3 Drawing Sheets

(51) Int. Cl.
  *H01L 21/324* (2006.01)
  *H01L 29/786* (2006.01)
  *H01L 29/06* (2006.01)
  *H01L 29/08* (2006.01)
  *H01L 29/78* (2006.01)
  *H01L 21/02* (2006.01)

(52) U.S. Cl.
  CPC .......... *H01L 21/268* (2013.01); *H01L 21/324* (2013.01); *H01L 29/06* (2013.01); *H01L 29/08* (2013.01); *H01L 29/66492* (2013.01); *H01L 29/786* (2013.01); *H01L 29/7833* (2013.01); *H01L 21/0262* (2013.01); *H01L 21/02532* (2013.01); *H01L 21/02576* (2013.01)

(58) Field of Classification Search
  CPC ....... H01L 21/339; H01L 27/12; H01L 31/00; H01L 21/84; H01L 21/00; H01L 31/0392; G02F 1/136; G02F 1/1335; G02F 1/1337; G02F 1/1333
  See application file for complete search history.

ns of the present invention. Persons of ordinary skill in the art may obtain other figures according to the illustrated figures without creative works.

LOW TEMPERATURE POLYSILICON THIN FILM TRANSISTOR AND METHOD FOR FABRICATING SAME

TECHNICAL FIELD

The present invention relates to fabricating of transistors, and more particularly to a method for fabricating a low temperature polysilicon thin film transistor, and also relates to a low temperature polysilicon thin film transistor.

BACKGROUND

In the known art, as shown in FIG. 1, the structure of a known low temperature polysilicon thin film transistor (LTPS-TFT) is shown.

It is not difficult to obtain a method for fabricating the LTPS-TFT from the illustrated structure, which is described as follows.

A substrate layer, a SiNx layer, and a SiOx layer are sequentially deposited to form a substrate, and then an a-Si (amorphous silicon) layer is deposited. The a-Si layer is irradiated by laser to recrystallize the a-Si layer into a polysilicon film. A pattern layer structure can be then formed using a yellow light/etching process.

After that, N+ doped area and N− doped (lightly doped drain) area are defined in the pattern layer structure using two masks and corresponding yellow light photoresists, respectively. The N+ and N− doped areas are doped with different dosage of P31 (i.e., phosphorus having relative molecular weight of 31). That is, P31 is doped using an ion implantation process to obtain the N− area.

After multiple depositing processes, yellow light processes and etching processes, a gate insulator (silicon nitride), a gate electrode (GE), a source electrode and a drain electrode as shown in figure are formed.

It is not difficult to understand that the existing technique employees repeating depositing processes, yellow light processes and etching processes. The complexity of the process is increased, the manufacturing cost is high and the producing efficiency is relatively low.

SUMMARY

Therefore, the embodiment of the present invention provides a low temperature polysilicon thin film transistor and a method for fabricating the same, which is capable of reducing the process complexity and the cost, and improving the producing efficiency.

To solve the above problems, an embodiment of the present invention provides a method for fabricating a low temperature polysilicon thin film transistor. The method includes the following steps: An N+ silicon doped layer is deposited on a substrate using a material including silane, phosphine and hydrogen. Then, a first doped layer and a second doped layer opposite to the first doped layer is formed using a pattern etching process. An amorphous silicon (a-Si) layer is deposited on the N+ silicon doped layer. A laser annealing process and a pattern etching process are performed to the a-Si layer thereby remaining only a portion of the a-Si layer located in a channel between the first doped layer and the second doped layer, A high temperature effect applied to the remained portion of the a-Si layer by the laser annealing process forms a first lightly doped drain (LDD) terminal between the first doped layer and the remained portion of the a-Si layer, and forms a second LDD terminal between the second doped layer and the remained portion of the a-Si layer, respectively. A first phosphor material structure is formed on the first doped layer and the first LDD terminal, and a second phosphor material structure is formed on the second doped layer and the second LDD terminal. A gate metal layer is then formed on the remained portion of the a-Si layer. A source metal layer and a drain metal layer are formed on the first doped layer and the second doped layer located at opposite sides of the gate metal layer, respectively.

In one embodiment, the first LDD terminal and the first phosphor material structure are formed by applying a high temperature expansion process to the phosphor material contained in the first doped layer; and the second LDD terminal and the second phosphor material structure are formed by applying a high temperature expansion process to the phosphor material contained in the second doped layer.

In one embodiment, an excimer laser annealing process is used in the step of performing the laser annealing and the pattern etching process to the a-Si layer.

In one embodiment, the a-Si layer is recrystallized into a polysilicon thin film in the step of performing the laser annealing and the pattern etching process to the a-Si layer.

In one embodiment, the phosphor material contained in the first doped layer and the second doped layer expands along a direction towards the polysilicon thin film at a high temperature.

In one embodiment, the relative molecular weight of the phosphor material contained in the N+ silicon doped area is equal to 31.

In one embodiment, prior to the step of the N+ silicon doped layer is deposited on a substrate using a material comprising silane, phosphine and hydrogen and the first doped layer and the second doped layer opposite to the first doped layer are formed using a pattern etching process, the method further includes a step of: controlling the mass ratio of phosphine in the material gas to control the resistance of the first LDD terminal and the second LDD terminal.

In one embodiment, yellow light irradiation is used in the etching process of the step of forming the opposite first doped layer and the second doped layer.

In one embodiment, the step of performing a laser annealing process and a pattern etching process to the a-Si layer includes a dehydrogenation process to the a-Si layer.

To solve above problems, embodiments of the present invention further provides a low temperature polysilicon thin film transistor that is fabricated by any one of the above methods.

The advantages of the above embodiments are described as follows. According to the embodiments, the LDD terminal and the phosphor material structure are formed automatically by a phosphor diffusion of the phosphor material contained in the N+ silicon doped layer when the high temperature of the laser annealing process is applied to the N+ silicon doped layer. The times of using photomasks are reduced, the fabricating process is simplified. Compared with the existing technique, the embodiments of the present invention reduce two ion implantation processes and corresponding photomasks. The process complexity is reduced, the manufacturing cost is reduced, and the production efficiency is improved.

BRIEF DESCRIPTION OF THE DRAWINGS

To illustrate the technical solution provided by embodiments of the present invention more clearly, the figures used to illustrate the embodiments are introduced as follows. Obviously, the listed figures only illustrate some embodiments of the present invention. Those one of ordinarily skilled in the art can also obtain other figures according to the illustrated ones without any creative working.

FIGS. 3 to 6 are schematic views of the fabricating method of FIG. 2, wherein FIG. 6 is a schematic view illustrating a partial structure of a low temperature polysilicon thin film transistor obtained from the method of FIG. 2.

DETAILED DESCRIPTION OF PREFERRED EMBODIMENTS

The technical details of embodiments of the present invention are described clearly and completely with the reference to the figures. Obviously, the described embodiments are only a part of the embodiments, and are not all the embodiments. Based upon these described embodiments, one of ordinarily skilled in the art can obtain other embodiments without any creative working, and these obtained embodiments should also be included in the scope of the present invention.

Figure 1:
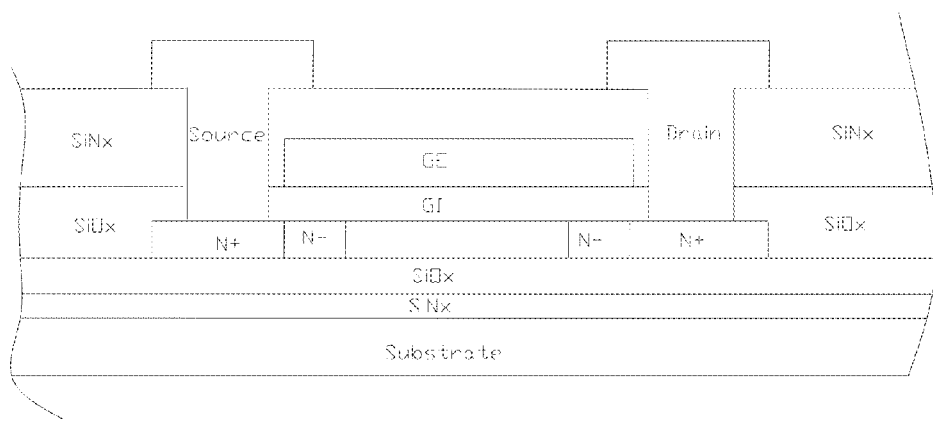
FIG. 1 is a schematic view illustrating a partial structure of an existing low temperature polysilicon thin film transistor.
Figure 2:
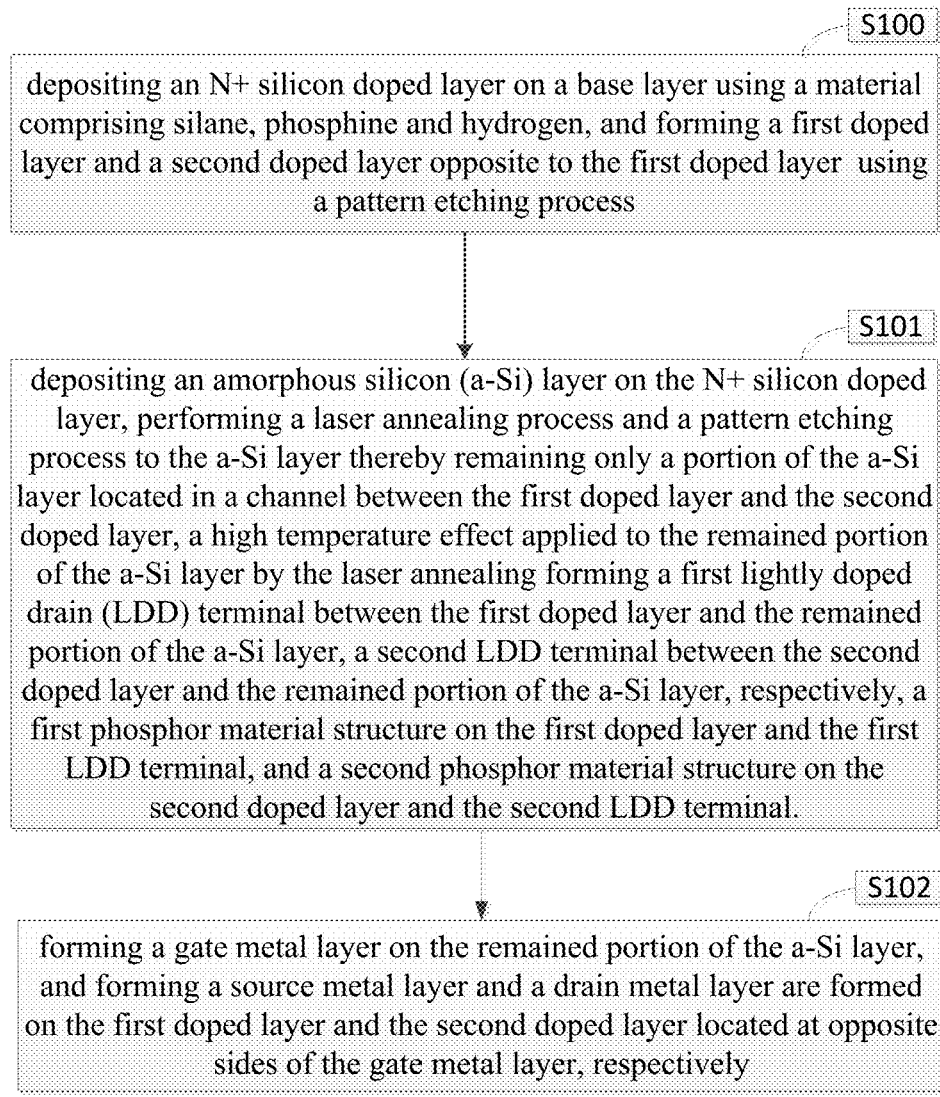
FIG. 2 is a flow chart of a method for fabricating a low temperature polysilicon thin film transistor according to one embodiment of the present invention.

Referring to FIG. 2, FIG. 2 is a flow chart of a method for fabricating a low temperature polysilicon thin film transistor according to one embodiment of the present invention. The method of the present embodiment includes the following steps.

Step S100, depositing an N+ silicon doped layer on a base layer using a material comprising silane, phosphine and hydrogen, and forming a first doped layer and a second doped layer opposite to the first doped layer using a pattern etching process.

Figure 3:
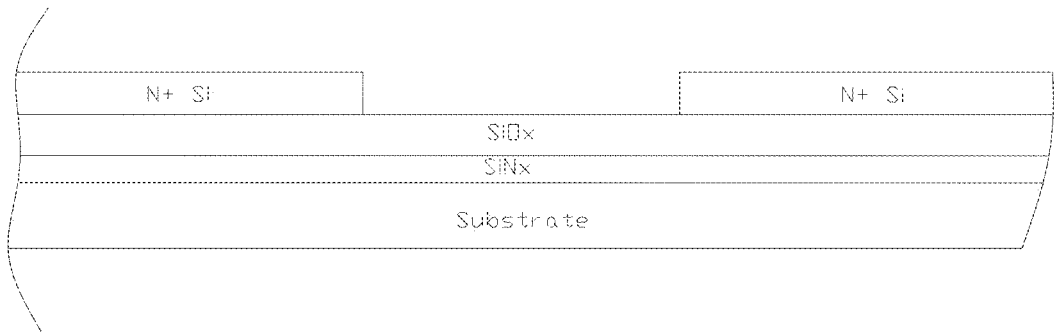

In the step S100, as shown in FIG. 3, the base layer includes a substrate, a SiNx layer and a SiOx layer. The methods or processes used to form the base layer can be any suitable methods in the exiting art can be understood by one of ordinarily skilled in the art, and the methods or processes are not limited.

It is not difficult to understand that molecular formula of silane, phosphine and hydrogen, which are used in the present embodiment, are SiH4, PH3 and H2, respectively. These gases are used as the gas to depositing the film in the present embodiment. However, the material can further include other compositions. In addition, the mass ratio of silane, phosphine and hydrogen in the material gas can be adjusted according to the process requirements.

The pattern etching process in the present embodiment can use the commonly known yellow light exposure and etching process, and is not further described here. The first doped layer and the second doped layer, for example, are the two N+ silicon doped layer opposite to each other as shown in FIG. 3.

Step S101, depositing an amorphous silicon (a-Si) layer on the N+ silicon doped layer, performing a laser annealing process and a pattern etching process to the a-Si layer thereby remaining only a portion of the a-Si layer located in a channel between the first doped layer and the second doped layer, a high temperature effect applied to the remained portion of the a-Si layer by the laser annealing forming a first lightly doped drain (LDD) terminal between the first doped layer and the remained portion of the a-Si layer, a second LDD terminal between the second doped layer and the remained portion of the a-Si layer, respectively, a first phosphor material structure on the first doped layer and the first LDD terminal, and a second phosphor material structure on the second doped layer and the second LDD terminal.

Figure 4:
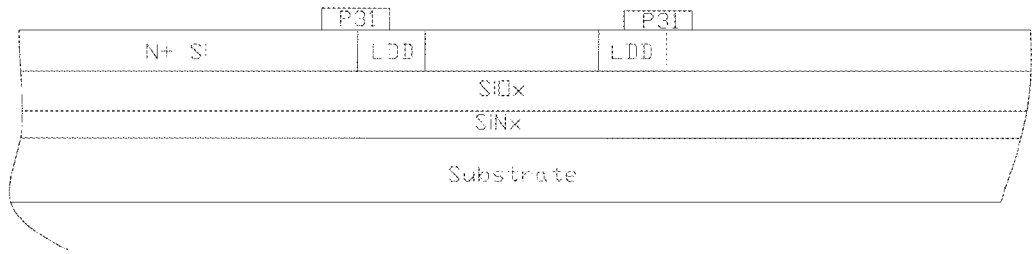

It is to be noted that, as shown in FIG. 4, the first LDD terminal and the first phosphor material structure P31 are formed by the heat diffusion of the phosphor material contained in the first N+ silicon doped layer at a high temperature, the second LDD terminal and the second phosphor material structure P31 are formed by the heat diffusion of the phosphor material contained in the first, second N+ silicon doped layer at a high temperature. It is not difficult to understand that the relative molecular weight of the phosphor material contained in the N+ silicon doped layer is 31. Since the phosphor material contained in the N+ silicon doped layer diffuses rapidly at a high temperature, and thus the existing ion implantation process is not required now.

To perform the laser annealing and the pattern etching process to the a-Si layer, an excimer laser annealing processed is preferred in the present embodiment. Specifically, the a-Si layer is recrystallized into a polysilicon thin film (the structure between the two LDD terminals) by the laser annealing process. As shown in FIG. 4, the phosphor material contained in the first doped layer and the second doped layer diffuse along a direction towards the polysilicon thin film, thereby forming the first, second LDD terminals and the first, second phosphor material structure P31.

Prior to the annealing process, the present embodiment may further include a dehydrogenation process to the a-Si layer.

It is to be noted that, prior to the step 100, the mass ratio of phosphine in the material gas can be controlled to control the resistance of the first LDD terminal and the second LDD terminal. In other words, by controlling the mass ratio of phosphine in the material gas, the phosphor concentration and the volume of obtained structure can be controlled to obtain better structure and performance.

Step S102, forming a gate metal layer on the remained portion of the a-Si layer, and forming a source metal layer and a drain metal layer are formed on the first doped layer and the second doped layer located at opposite sides of the gate metal layer, respectively.

Figure 5:
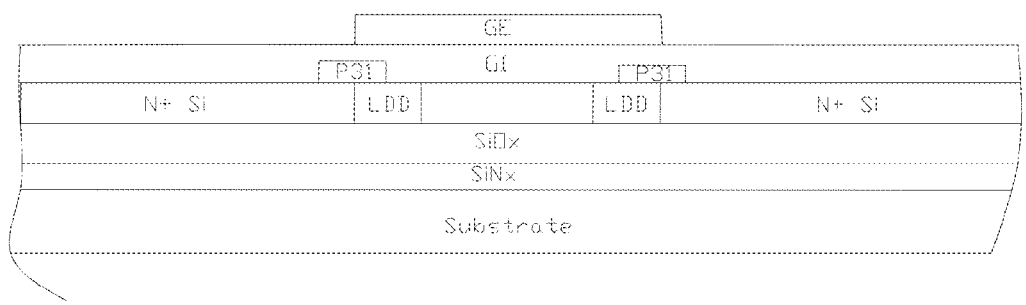
Figure 6:
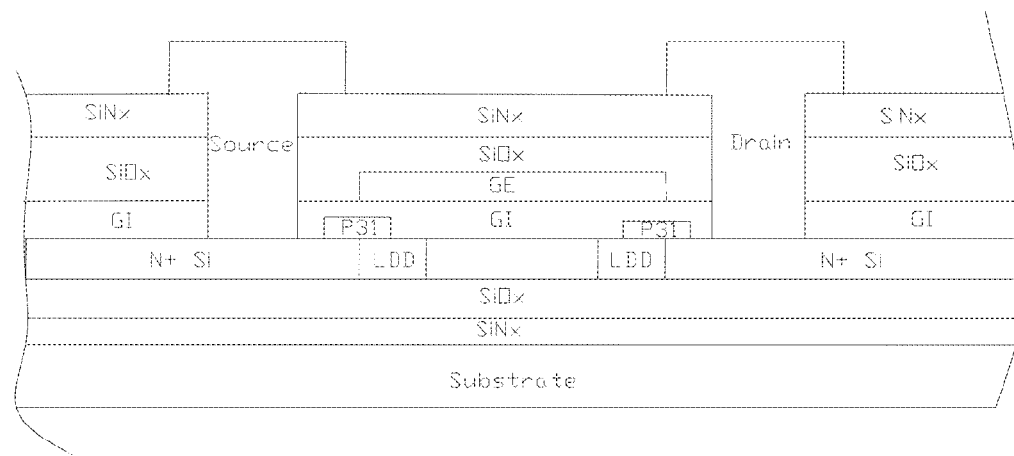

In the step S102, as shown in FIGS. 5 and 6, a gate insulator layer comprised of SiNx and a gate electrode layer comprised of a metal material are formed to obtain the gate metal layer, then an inter-layer dielectric (ILD) layer comprised of SiOx and SiNx can also be formed (not shown).

The source metal layer, for example, is the source layer as shown in FIG. 6, and the drain metal layer is the drain layer as shown in FIG. 6

According to the process provided in the above embodiment, the LDD terminal and the phosphor material structure are formed automatically by a phosphor diffusion of the phosphor material contained in the N+ silicon doped layer when the high temperature of the laser annealing process is applied to the N+ silicon doped layer. The times of using photomasks are reduced, and the fabricating process is simplified.

The embodiment of the present invention reduces two ion implantation processes and corresponding photomasks. The process complexity is reduced, the manufacturing cost is reduced, and the production efficiency is improved.

Referring to FIG. 6, another embodiment of the present invention provides a low temperature polysilicon thin film transistor that can be fabricated by method according to any one of the above embodiments.

In the present embodiment, the low temperature polysilicon thin film transistor includes, but not limited to, a base layer (comprising a substrate layer, a SiNx layer and a SiOx layer sequentially stacked together), oppositely disposed first doped layer and second doped layer, the first, second LDD terminal, the first, the second phosphor material structure P31, the gate metal layer, the source metal layer and the drain metal layer. The fabricating process of the structure can be referred back to the description of the above embodiments, which can be reasonably understood by one of ordinarily skilled in the art, and thus the process is not further described further.

The low temperature polysilicon thin film transistor of the present embodiment can be used in an organic light emitting diode display.

Similarly, the first, second LDD terminals and the first, second phosphor material structures P31 are formed automatically by a phosphor diffusion of the phosphor material contained in the N+ silicon doped layer when the high temperature of the laser annealing process is applied to the N+ silicon doped layer. The structure is simple and the fabricating process is also simple. In detail, the present embodiment reduces two ion implantation processes and corresponding photomasks. The process complexity is reduced, the manufacturing cost is reduced, and the production efficiency is improved.

The above description is only embodiment of the present invention, and is not used to limit the scope of the present invention. Any equivalent structure or equivalent flow alternatives made from the specification and figures of the present invention, such as combination of different embodiments, or direct or indirect application of the present invention into other related fields, should be included in the scope of the present invention.

What is claimed is:

1. A method for fabricating a low temperature polysilicon thin film transistor, comprising:

depositing an N+ silicon doped layer on a substrate using a material comprising silane, phosphine and hydrogen, and forming a first doped layer and a second doped layer opposite to the first doped layer using a pattern etching process;

depositing an amorphous silicon (a-Si) layer on the N+ silicon doped layer, performing a laser annealing process and a pattern etching process to the a-Si layer thereby remaining only a portion of the a-Si layer located in a channel between the first doped layer and the second doped layer; wherein in the laser annealing process, the a-Si layer is crystallized into a polysilicon thin film by laser and a high temperature effect applied to the a-Si layer forms a first lightly doped drain (LDD) terminal between the first doped layer and the polysilicon thin film, a second LDD terminal between the second doped layer and the polysilicon thin film, a first phosphor material structure on the first doped layer and the first LDD terminal, and a second phosphor material structure on the second doped layer and the second LDD terminal; the first LDD terminal and the first phosphor material structure are formed by a high temperature diffusion process of a phosphorus material contained in the first doped layer, and the second LDD terminal and the second phosphor material structure are formed by a high temperature diffusion process of a phosphorus material contained in the second doped layer;

forming a gate metal layer on the polysilicon thin film, and forming a source metal layer and a drain metal layer on the first doped layer and the second doped layer located at opposite sides of the gate metal layer, respectively.

2. A method for fabricating a low temperature polysilicon thin film transistor, comprising:

depositing an N+ silicon doped layer on a substrate using a material comprising silane, phosphine and hydrogen, and forming a first doped layer and a second doped layer opposite to the first doped layer using a pattern etching process;

depositing an amorphous silicon (a-Si) layer on the N+ silicon doped layer, performing a laser annealing process and a pattern etching process to the a-Si layer thereby remaining only a portion of the a-Si layer located in a channel between the first doped layer and the second doped layer; wherein in the step of performing a laser annealing process and a pattern etching process to the a-Si layer, the a-Si layer is crystallized into a polysilicon thin film and a high temperature effect applied to the a-Si layer forms a first lightly doped drain (LDD) terminal between the first doped layer and the polysilicon thin film, a second LDD terminal between the second doped layer and the polysilicon thin film, a first phosphor material structure on the first doped layer and the first LDD terminal, and a second phosphor material structure on the second doped layer and the second LDD terminal;

forming a gate metal layer on the polysilicon thin film, and forming a source metal layer and a drain metal layer on the first doped layer and the second doped layer located at opposite sides of the gate metal layer, respectively.

3. The method of claim 2, wherein the first LDD terminal and the first phosphor material structure are formed by a high temperature diffusion process of a phosphorus material contained in the first doped layer, and the second LDD terminal and the second phosphor material structure are formed by a high temperature diffusion process of a phosphorus material contained in the second doped layer.

4. The method of claim 3, wherein an excimer laser annealing process is used in the step of performing a laser annealing process and a pattern etching process to the a-Si layer.

5. The method of claim 3, wherein the phosphorus material contained in the first doped layer and the second doped layer diffuses along a direction towards the polysilicon thin film at a high temperature.

6. The method of claim 2, wherein a relative molecular weight of a phosphorus material contained in the N+ silicon doped layer is equal to 31.

7. The method of claim 2, wherein the method further comprising following step prior to the step of depositing an N+ silicon doped layer on a substrate using a material comprising silane, phosphine and hydrogen, and forming a first doped layer and a second doped layer opposite to the first doped layer using a pattern etching process:

controlling the mass ratio of phosphine in the material thereby controlling the resistance of the first and second LDD terminals.

8. The method of claim 3, the method further comprising following step prior to the step of depositing an N+ silicon doped layer on a substrate using a material comprising silane, phosphine and hydrogen, and forming a first doped layer and a second doped layer opposite to the first doped layer using a pattern etching process:

controlling the mass ratio of phosphine in the material thereby controlling the resistance of the first and second LDD terminals.

9. The method of claim 4, the method further comprising following step prior to the step of depositing an N+ silicon doped layer on a substrate using a material comprising silane, phosphine and hydrogen, and forming a first doped layer and a second doped layer opposite to the first doped layer using a pattern etching process:
controlling the mass ratio of phosphine in the material thereby controlling the resistance of the first and second LDD terminals.

10. The method of claim 2, the method further comprising following step prior to the step of depositing an N+ silicon doped layer on a substrate using a material comprising silane, phosphine and hydrogen, and forming a first doped layer and a second doped layer opposite to the first doped layer using a pattern etching process:
controlling the mass ratio of phosphine in the material thereby controlling the resistance of the first and second LDD terminals.

11. The method of claim 5, the method further comprising following step prior to the step of depositing an N+ silicon doped layer on a substrate using a material comprising silane, phosphine and hydrogen, and forming a first doped layer and a second doped layer opposite to the first doped layer using a pattern etching process:
controlling the mass ratio of phosphine in the material thereby controlling the resistance of the first and second LDD terminals.

12. The method of claim 6, the method further comprising following step prior to the step of depositing an N+ silicon doped layer on a substrate using a material comprising silane, phosphine and hydrogen, and forming a first doped layer and a second doped layer opposite to the first doped layer using a pattern etching process:
controlling the mass ratio of phosphine in the material thereby controlling the resistance of the first and second LDD terminals.

13. The method of claim 2, wherein a yellow light exposure process is used in the step of forming the first doped layer and the second doped layer using a pattern etching process.

14. The method of claim 2, an dehydrogenation process is performed to the a-Si layer in the step of performing a laser annealing process and a pattern etching process to the a-Si layer.

15. A low temperature polysilicon thin film transistor, being fabricated by a method comprising the following steps:
depositing an N+ silicon doped layer on a substrate using a material comprising silane, phosphine and hydrogen, and forming a first doped layer and a second doped layer opposite to the first doped layer using a pattern etching process;
depositing an amorphous silicon (a-Si) layer on the N+ silicon doped layer, performing a laser annealing process and a pattern etching process to the a-Si layer thereby remaining only a portion of the a-Si layer located in a channel between the first doped layer and the second doped layer; wherein in the laser annealing process, the a-Si layer is crystallized into a polysilicon thin film and a high temperature effect applied to the a-Si layer forms a first lightly doped drain (LDD) terminal between the first doped layer and the polysilicon thin film, a second LDD terminal between the second doped layer and the polysilicon thin film, a first phosphor material structure on the first doped layer and the first LDD terminal, and a second phosphor material structure on the second doped layer and the second LDD terminal;
forming a gate metal layer on the polysilicon thin film, and forming a source metal layer and a drain metal layer on the first doped layer and the second doped layer located at opposite sides of the gate metal layer, respectively.

* * * * *